US006790689B2

(12) United States Patent
Behfar (10) Patent No.: US 6,790,689 B2
(45) Date of Patent: Sep. 14, 2004

(54) CURVED WAVEGUIDE RING LASER (75) Inventor: Alex Behfar, Ithaca, NY (US)

(73) Assignee: BinOptics Corporation, Ithaca, NY (US)

( * ) Notice: Subject to any disclaimer, the term of this patent is extended or adjusted under 35 U.S.C. 154(b) by 80 days.

(21) Appl. No.: 10/326,084

(22) Filed: Dec. 23, 2002

(65) Prior Publication Data

US 2003/0123510 A1 Jul. 3, 2003

Related U.S. Application Data (62) Division of application No. 09/918,544, filed on Aug. 1, 2001, now Pat. No. 6,680,961.

(51) Int. Cl.⁷ ............................................. H01L 21/00
(52) U.S. Cl. ............................. 438/22; 438/40; 438/940
(58) Field of Search ................................. 438/218, 216, 438/22, 24, 33, 40, 662, 940; 219/121.6; 264/48; 372/92–94, 45, 64

(56) References Cited

U.S. PATENT DOCUMENTS

| 4,851,368 A | * | 7/1989 | Behfar-Rad et al. ............ 438/39 |
|---|---|---|---|
| 4,924,476 A | * | 5/1990 | Behfar-Rad et al. ............ 372/94 |
| 5,031,190 A | * | 7/1991 | Behfar-Rad .................... 372/94 |
| 5,132,983 A | * | 7/1992 | Behfar-Rad .................... 372/94 |
| 5,313,488 A | | 5/1994 | Podgorski |
| 5,349,601 A | | 9/1994 | Hohimer |
| 5,764,681 A | | 6/1998 | Ballantyne |
| 5,790,583 A | * | 8/1998 | Ho ................................ 372/92 |
| 5,878,070 A | * | 3/1999 | Ho et al. ....................... 372/92 |
| 5,987,046 A | * | 11/1999 | Kobayashi et al. ............ 372/45 |
| 6,281,523 B1 | * | 8/2001 | Iwai et al. ..................... 257/98 |
| 6,385,224 B1 | * | 5/2002 | Jiang et al. .................... 372/46 |
| 6,680,961 B2 | * | 1/2004 | Behfar .......................... 372/94 |
| 6,717,187 B2 | * | 4/2004 | Kondo et al. ................ 257/183 |
| 2002/0176087 A1 | * | 11/2002 | Numai ........................ 356/461 |

* cited by examiner

Primary Examiner—Don Wong
Assistant Examiner—Hung Tran Vy (57) ABSTRACT

A ring-type laser including a traveling wave cavity which incorporates at least first and second straight cavity sections and at least one curved cavity section. Corresponding first ends of the straight cavity sections are interconnected at a first light-emitting facet, and second ends of the straight sections are interconnected by the curved waveguide. Additional curved and straight sections can be linked to provide various ring configurations.

6 Claims, 8 Drawing Sheets

CURVED WAVEGUIDE RING LASER

This application is a divisional of application Ser. No. 09/918,544, filed on Aug. 1, 2001 now U.S. Pat. No. 6,680,961.

BACKGROUND OF THE INVENTION

The present invention relates, in general, to a ring laser having a curved waveguide cavity, and more particularly to a ring laser having at least one curved segment coupled to two straight segments, with the straight segments being joined at a partially transmitting facet, and to an improved process for making such lasers.

Advances in current monolithic integration technology have allowed lasers of complicated geometry to be fabricated, including ring lasers with a variety of cavity configurations. Examples of such ring lasers are found in U.S. Pat. Nos. 4,851,368, issued Jul. 25, 1989, 4,924,476 issued May 8, 1990, and 5,132,983, issued Jul. 21, 1992, the disclosures of which are hereby incorporated herein by reference. These patents disclose traveling wave semiconductor lasers, and more particularly ring-type lasers utilizing straight legs intersecting at facets, some of the facets having total internal reflection and at least one facet permitting emission of laser light generated in the ring laser. The patents also disclose a method of forming the lasers as ridges on a substrate, and in particular chemically assisted ion beam etching process for this purpose.

Conventional pn junction lasers utilize a semiconductor material such as gallium arsenide to form a Fabry-Perot resonant cavity having parallel, semi-reflective end faces, or facets, with the other set of faces on the cavity being roughened to suppress light energy in any modes except the mode propagating between the end faces. The junction between the n-type and p-type layers of the semiconductor forms the active region of the laser so that a bias voltage, connected across the wafer by means of metallization on the upper and lower surfaces, for example, serves to stimulate transitions between energy states within the semiconductor material, causing light to propagate along the length of the device.

A ring cavity laser possesses benefits that a Fabry-Perot cavity does not provide; for example, it provides lasing action with higher spectral purity. The development of ring cavity lasers expanded the prospective applications for integrated semiconductor lasers, and added the attractiveness of greater manufacturability and reduced cost. Such ring cavity lasers have relied on total internal reflection (TIR) facets as well as partially transmitting (PT) facets to produce traveling waves within the laser which are emitted at selected locations. However, it has been found that the use of TIR facets in such devices can lead to large optical cavities, and accordingly a new technique for fabricating ring lasers that can reduce or eliminate the reliance on TIR facets is needed.

SUMMARY OF THE INVENTION

In accordance with the present invention, a reduction in the length of ring laser cavities is obtained by providing a cavity that consists of at least one curved waveguide section and at least one partially transmitting (PT) facet. The curved segment preferably joins corresponding first ends of at least two straight waveguide segments which are joined at their second ends to form the PT facet. The curved waveguide section acts as an optical waveguide to guide laser light from one straight leg segment to the other with low loss, and partially or completely eliminates the need for TIR facets in the formation of a ring laser.

In its simplest form, the ring cavity of the present invention combines a curved waveguide with two straight waveguides and a single PT facet to form a cavity in the shape of a teardrop, when viewed in top plan view. The facet serves as an emitting surface for the laser light, and the curved shape reduces the overall length of the cavity while still retaining the higher spectral purity that is a characteristic of ring cavities.

The curved ring cavity of the invention may be fabricated as a ridge laser using known process, but alternatively may be fabricated by an improved narrow-width process which uses air or another gas as the medium outside the laser cavity. The width of the cavity produced by this process is less than 1.0 micron, and preferably about 0.2 micron for single lateral mode operation.

BRIEF DESCRIPTION OF THE DRAWINGS

The foregoing, and additional objects, features and advantages of the present invention will be apparent to those of skill in the art from the following detailed description of preferred embodiments thereof, taken in conjunction with the accompanying drawings, in which.

DESCRIPTION OF PREFERRED EMBODIMENTS

Figure 1:
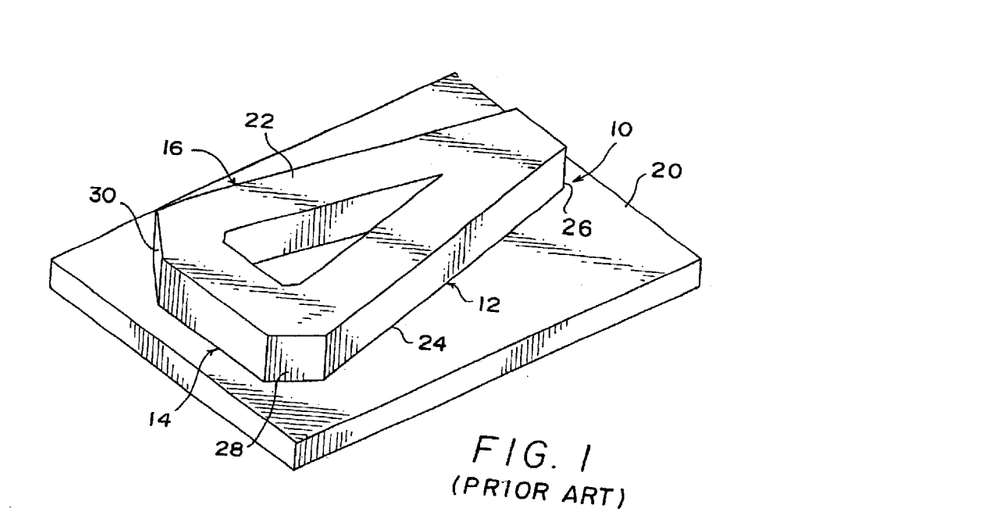
FIG. 1 is a diagrammatic top perspective of a prior art triangular ring laser.

FIG. 1 illustrates a ring laser 10, such as that described in the above-listed U.S. Pat. No. 4,924,476, having three adjacent linear cavity sections 12, 14 and 16 interconnected to form a closed triangular cavity. As illustrated, the laser 10 preferably is formed as a monolithic structure on a substrate 20, and may be fabricated utilizing conventional monolithic integration technology, as described in the '476 patent. Application of current through the laser device, as by application of a bias voltage between electrodes on the top and bottom surfaces 22 and 24, produces a lasing action within the body of the laser 10, creating optical traveling waves within the three sections 12, 14 and 16. In the triangular laser, the ring cavity is closed, so that optical waves travel around the ring, the three apexes of the cavity incorporating facets such as those illustrated at 26, 28 and 30 which are at least partially internally reflective to produce the traveling wave of light within the laser.

The surfaces of the facets are optically smooth, and the legs are angled with respect to each other so that two of the facets receive light at an angle greater than the critical angle and are fully internally reflective, while the third receives light at a preselected angle less than the critical angle so that a corresponding proportion of the laser light is internally reflected and a portion of the incident light is transmitted. The angular relationship of the three facets is selected to produce the desired threshold current for achieving stimulated emission and thus to produce the desired laser light output. In the embodiment illustrated in FIG. 1, facets 28 and 30 are totally internally reflective (TIR) and facet 26 is partially transmissive (PT) to permit emergence of light.

As discussed in the above-identified '476 patent, light traveling within the cavity of laser 10 and impinging on the surface of a facet will transmit a substantial portion of the light energy which strikes it at an angle perpendicular to the surface of the facet. However, light impinging on the surface at an angle away from the perpendicular will have a large portion of its energy reflected, and will provide a lower amount of emergent light. At a certain transition angle, which will depend upon the refractive indices of the materials on opposite sides of the surface of the facet, the incident light will travel along the facet surface, and this angle is the critical angle. Light striking the surface at an angle greater than the critical angle will be totally internally reflected. Varying the angle of impingement of the light from the perpendicular to the critical angle will vary the amount of emergent light from a maximum value to zero, thereby providing a design parameter for the laser 10 that will permit control of the amount of light which emerges from the facet 26. Since the amount of internally reflected light in part determines the threshold current required for producing the lasing action, the angle of incidence provides a controllable parameter for regulating and reducing the current required for achieving stimulated emission.

Also as described in the aforesaid '476 patent, the laser of FIG. 1 is fabricated utilizing suitable etching procedures which allow the shape of the device to be determined, allow roughened wall surfaces to be provided to prevent lateral oscillations within the laser body, and which produce vertical, smooth facets at the ends of the three legs of the laser cavity to assure proper laser operation. As pointed out in the '476 patent, the ring laser may be a stripe or a ridge laser having narrow active areas and fabricated through the processing steps described in IEEE Journal of Quantum Electronics, Vol. 28, pages 1227–1231 (hereinafter referred to as the Ridge Process), the disclosure of which is hereby incorporated herein by reference. The ridge laser is one example of a technique for providing lateral guidance of the light traveling in the laser cavity; however, many other laser waveguide structures can be used to provide lateral confinement of the light. For example, a buried rib waveguide, the use of selective area epitaxy, the use of impurity disordering, and etching and regrowth techniques can produce lateral confinement.

Figure 2:
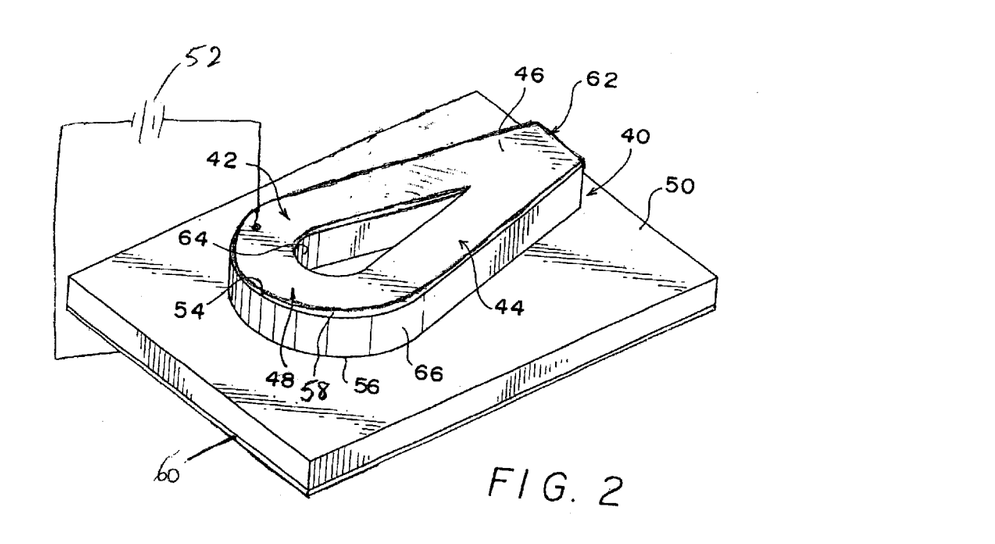
FIG. 2 is a diagrammatic top perspective view of a teardrop-shaped ring laser incorporating a curved waveguide in accordance with the present invention.

FIG. 2 illustrates an improved waveguide configuration which eliminates two of the facets utilized in the prior art device of FIG. 1. A laser 40, in accordance with the present invention, utilizes a curved waveguide segment instead of angled facets to direct the traveling light wave around the laser body. The ring laser 40 of this invention includes first and second linear cavity sections, or segments, 42 and 44 joined to each other at a junction 46 and interconnected at their opposite ends by a curved cavity section, or segment, 48. These cavity sections are interconnected so as to form the teardrop-shaped laser cavity 40, with the curved waveguide segment 48 guiding the light along a curved path with low loss and eliminating reliance on TIR facets to form a ring laser. Laser 40 is formed as a monolithic structure on a substrate 50, and may be fabricated utilizing the process described as the Narow-Width process of U.S. Pat. No. 5,132,983 or by the above-noted Ridge Process. The application of current through the laser device, utilizing, for example, a biasing voltage source 52 connected across the top and bottom surfaces 54 and 56 of the laser, as by way of a suitable electrode 58 on the top surface of the laser and an electrode 60 connected by way of substrate 50 to the bottom surface of the laser, for example, produces a lasing action within the body of laser 40 to create and propagate optical traveling waves within the sections 42, 44 and 48.

The teardrop-shaped ring laser 40 has a single facet 62 fabricated in region 46, at the intersection of adjacent cavity sections 42 and 44. The surface of this facet 62 is optically smooth, and the angles of the waveguide arms 42 and 44 are selected so that light traveling in the waveguide strikes this surface at an angle selected to permit the emission of light. The optical path around the teardrop-shaped cavity has a reduced dimension, as compared to the triangular laser of the prior art, providing a shorter path for the optical traveling wave generated by the bias voltage.

Figure 3:
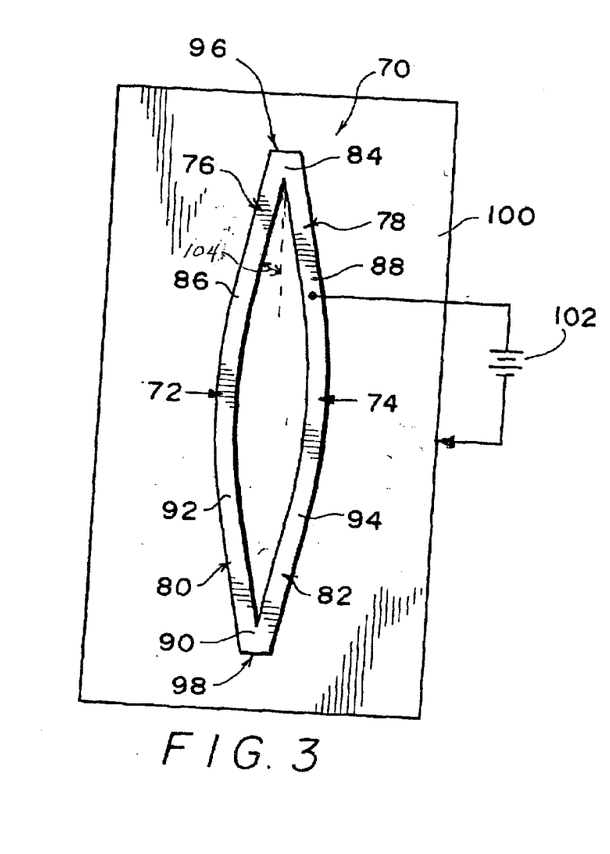
FIG. 3 is a diagrammatic top plan view of a ring laser cavity in accordance with the present invention, incorporating two curved waveguide sections and two PT facets.

The use of a curved waveguide to reduce the path length of a ring-type laser is not limited to the teardrop shape of FIG. 2, for curved waveguides may provide advantages in a variety of other ring-type optical waveguides. Thus, for example, FIG. 3 illustrates a ring laser 70 which incorporates two curved cavity sections 72 and 74 and four straight cavity sections 76, 78, 80, and 82, interconnected to form a ring laser cavity. As illustrated, the first ends of straight or linear, cavity sections 76 and 78 are joined together at junction region 84 and are connected at their second or free ends 86 and 88, respectively, to corresponding ends of curved sections 72 and 74, respectively. In similar manner, straight sections 80 and 82 are connected at first ends at junction region 90, with their free ends 92 and 94, respectively, connected to corresponding ends of the curved segments 72 and 74, respectively.

A facet 96 is formed at the junction of sections 76 and 78, at region 84, while a facet 98 is similarly formed at the junction of straight sections 80 and 82, at region 90. Both facets preferably are PT facets so that the ring laser 70 emits a selected portion of the laser light traveling in to the cavity at each facet. The laser 70 preferably is formed as a monolithic structure on a substrate 100, in the manner described with respect to FIG. 2, with a bias voltage 102 being connected across the laser, between its upper and lower surfaces, in the manner described above.

Although the laser 70 is illustrated as having a relatively small angle 104, it will be understood that the angles between straight sections 76, 78, and 80, 82 can be varied, with the curvature of sections 72 and 74 also varying, and having a greater or lesser curvature as required to permit variations in the shape of the ring laser waveguide. Such variations permit control of the angle of incidence of the traveling waves in the laser cavity, and thus permit control of the emitted light. Similarly, although the lengths of sections 76 and 78 are equal to each other and are equal to the lengths of section 80 and 82 in the illustrated embodiment of FIG. 3, it will be understood that the relative lengths of these sections may be varied, as well.

Figure 4:
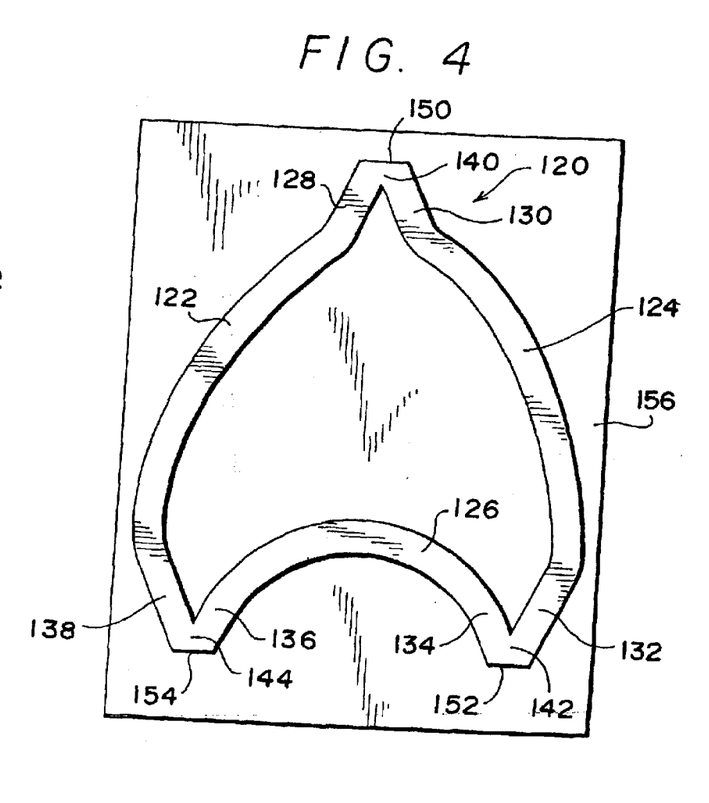
FIG. 4 is a diagrammatic top plan view of a third embodiment of the curved waveguide ring laser of the present invention, incorporating three curved waveguide segments and three PT facets.

A third embodiment of the curved waveguide ring laser of the present invention is illustrated in top plan view at 120 in FIG. 4. This embodiment is a ring laser having three curved cavity sections 122, 124, and 126, and six straight cavity sections 128, 130, 132, 134, 136 and 138, interconnected to form the ring laser cavity 120. The straight sections 128 and 130 are connected to each other at first ends injunction region 140, straight sections 132 and 134 are interconnected to each other at first ends in junction region 142, and straight sections 136 and 138 are connected to each other at first ends in junction region 144. The second ends of straight sections 128 and 138 are interconnected by curved section 122, the second ends of straight sections 130 and 132 are interconnected by curved section 124, and the second ends of straight sections 134 and 136 are interconnected by curved section 126 to complete the ring structure.

The laser 120 preferably is formed as a monolithic structure on a substrate, using either the Narrow-Width process or the Ridge Process, with a first facet 150 being formed at the intersection of cavity sections 128 and 130 in region 140, a second facet 152 being formed at the intersection of sections 132 and 134 in region 142, and the third facet being formed at the intersection of straight sections 136 and 138, in the region 144. These three facets preferably are PT facets to provide light emission in accordance with the angles at which the traveling optical wave within the laser cavity impinges on the three facets. It will be understood that a suitable bias voltage (not shown) is applied across the laser cavity to produce the traveling light wave within the optical cavity.

Figures 5, 6:
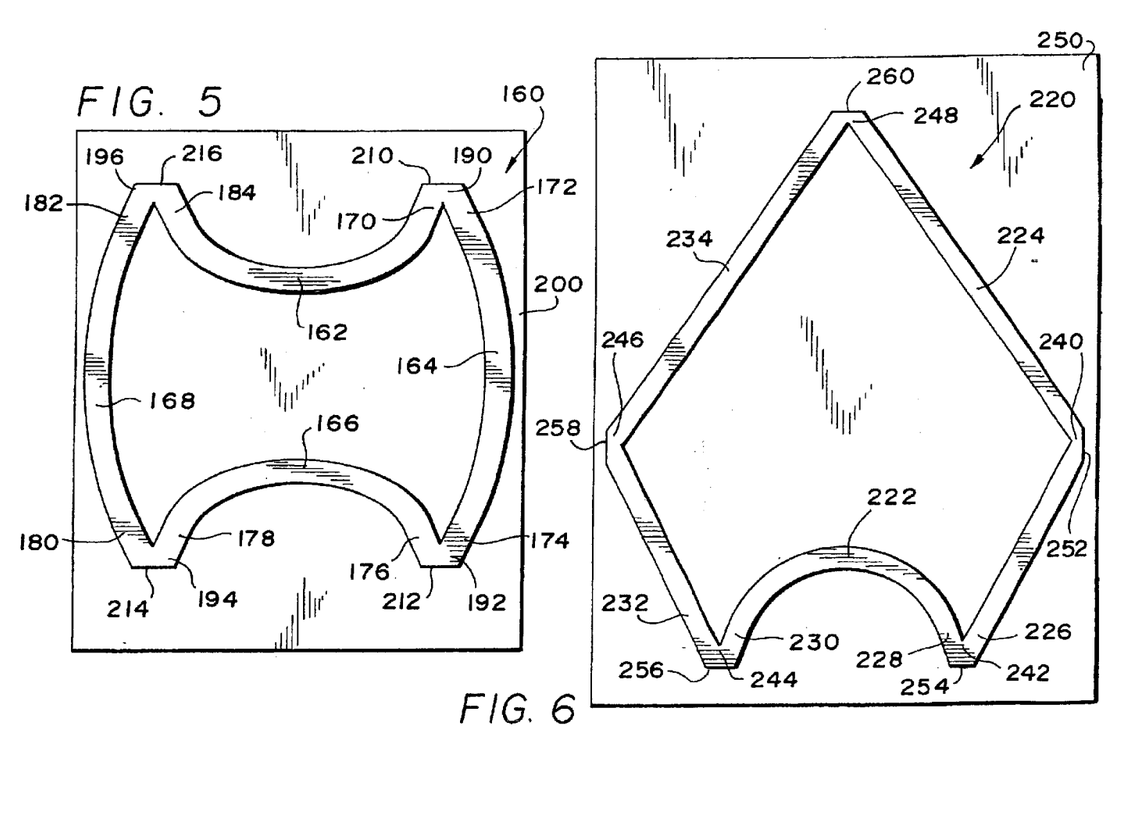
FIG. 5 is a diagrammatic top plan view of a fourth embodiment of the ring laser cavity of the present invention, incorporating four curved waveguide sections and four PT facets.
FIG. 6 is a diagrammatic top plan view of a fifth embodiment of the present invention, illustrating a ring laser cavity having a single curved waveguide section, three PT facets, and two TIR facets.

A fourth embodiment of the invention is illustrated in FIG. 5, wherein laser 160 incorporates four curved cavity sections 162, 164, 166 and 168, and eight straight cavity sections 170, 172, 174, 176, 178, 180, 182 and 184, all interconnected to form a continuous ring type laser cavity. The straight sections 170 and 172 are joined at their first ends at junction region 190, sections 174 and 176 are joined at their first ends in a region 192, straight sections 178 and 180 are joined at their first ends injunction region 194, and straight sections 182 and 184 are joined together at their first ends in junction region 196. The second end of straight section 170 is connected to the second end of straight section 184 by curved section 162, the second end of straight section 172 is connected to the second of straight section 174 by the curved section 164, the second end of straight sections 176 and 178 and interconnected by curved section 166, and the second ends of straight sections 180 and 182 are interconnected by curved section 168 to form a continuous laser waveguide. The laser 160 preferably is formed as a monolithic structure on a substrate 200, and facets 210, 212, 214 and 216 are fabricated at regions 190, 192, 194 and 196, respectively, to provide PT facets for emission of selected quantities of the light produced in the cavity of ring laser 160.

A fifth embodiment of the present invention is illustrated at 220 in top plan view in FIG. 6. The ring laser 220 includes one curved cavity section 222, and six straight cavity sections 224, 226, 228, 230, 232 and 234. The straight sections 224 and 226 are interconnected at their first ends in a junction region 240; straight sections 226 and 228 are interconnected at corresponding ends a junction region 242; straight sections 230 and 232 are interconnected at corresponding ends in a junction region 244; straight sections 232 and 234 are interconnected at corresponding ends in a junction region 246; and straight sections 234 and 224 are interconnected at corresponding ends in a junction region 248. The curved section 222 interconnects the free ends of straight sections 228 and 230 to complete the ring laser 220. The laser 220 preferably is formed as a monolithic structure on substrate 250, and includes a first facet 252 at region 240; a second facet 254 at region 242; a third facet 256 at region 244; a fourth facet 258 at region 246; and a fifth facet 260 at region 248. The facets 260, 254 and 256 preferably are PT facets while 252 and 258 preferably are TIR facets. As previously discussed, the application of a bias voltage across the laser cavity 220 produces a current which causes propagation of light energy within the laser in the manner described above.

As pointed out above, one process for fabricating the ring laser of the invention is the "narrow-width" process, which uses a single lithographical step as described and illustrated in U.S. Pat. No. 5,132,983. Lasers made by this process can support a single lateral mode. As described in the '983 patent, an example of the fabrication process starts with a wafer structure which includes an n-doped InP substrate with an n-type lower cladding, an active region, a p-type upper cladding, and a highly p-doped contact layer. To fabricate a laser device from this wafer, a material such as silicon dioxide is deposited on the wafer using a technique such as PECVD, to a thickness of about 500 nm. Then lithography and RIE are performed to pattern the silicon dioxide layer to form a mask, as described in U.S. Pat. No. 4,851,368. The mask pattern is transferred to the wafer, preferably using chemically assisted ion beam etching, to form the laser cavity's length, width and facets. An optically transparent and insulating material such as silicon dioxide (for example, spin-on glass) is deposited so as to completely bury the defined laser cavity, and an n-contact is deposited on the back side of the wafer. Thereafter, the spin-on glass layer as well as any residual mask material is etched away to expose the top of the laser structure, and a p-contact is deposited on the top surface, the p-contact and the n-contact providing electrical connections to the laser.

Figure 7A:
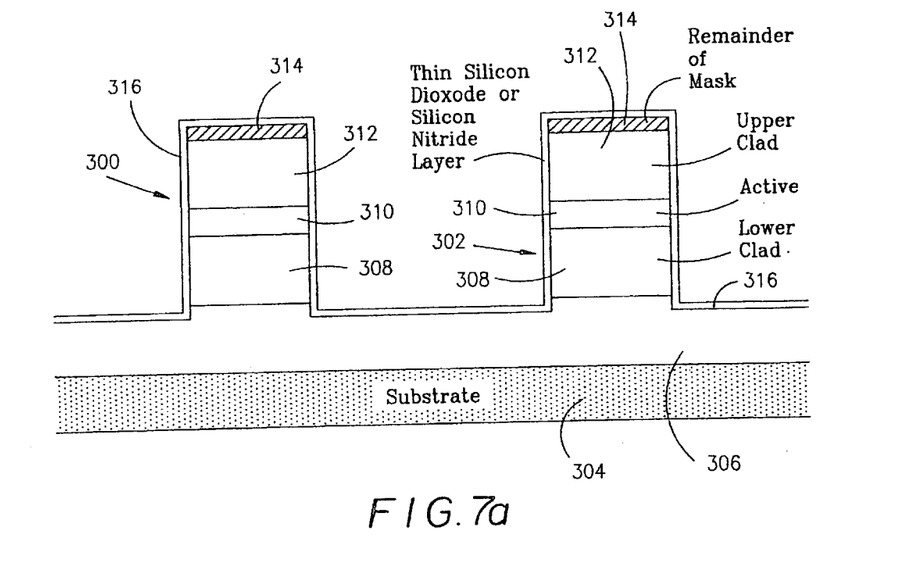
FIGS. 7a–7f illustrates an improved process for fabricating a narrow-width laser.
Figure 7B:
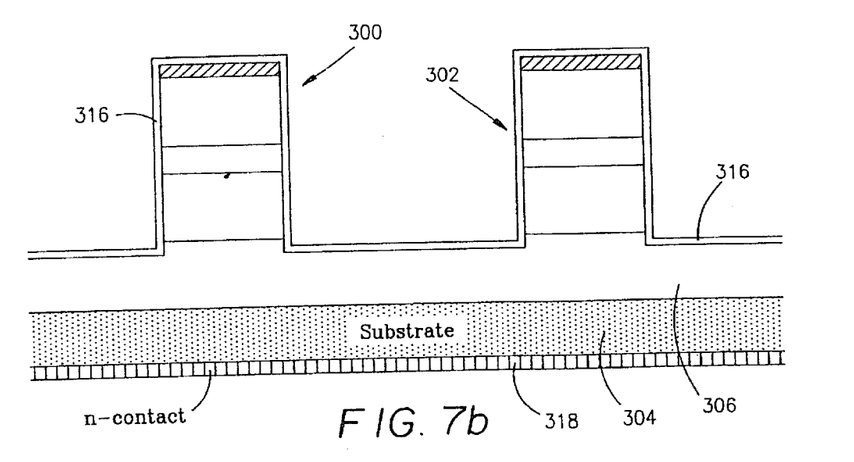
Figure 7C:
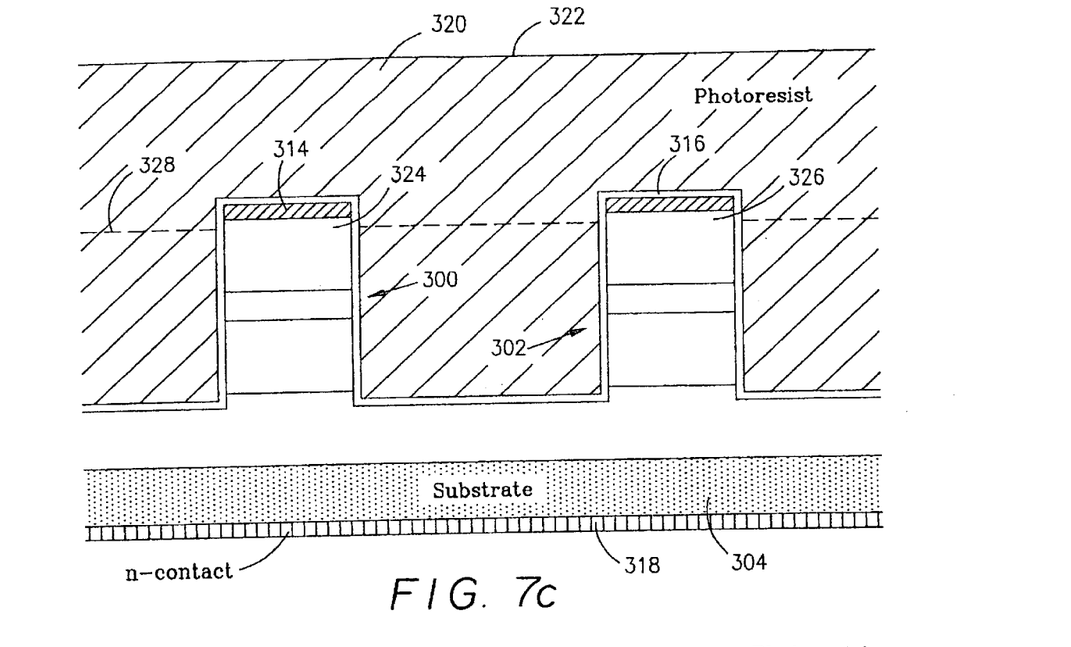

The narrow-width laser of the present invention preferably is fabricated using an improved process which eliminates the need for a dielectric medium outside the laser cavity, and this process is illustrated in FIGS. 7a–7f, to which reference is now made. The illustrated process steps, which permit the formation of narrow width ridge lasers using air or other gas as the medium outside the laser cavities, parallel the process steps described above, up to the completion of the etching step which forms the length, width and facets of laser cavities such as cavities 300 and 302. As illustrated, the laser cavities are formed on substrate 304, having an n-doped InP layer 306 on which is formed a lower cladding layer 308. An active layer 310 is formed on top of layer 308 and an upper cladding layer 312 is formed on top of the active layer. As illustrated in FIG. 7a, a mask layer 314 remains on top of each cavity.

In the process of the present invention, a thin conformal dielectric layer 316 of silicon dioxide, or in the alternative, silicon nitride, about 10 nm thick, for example, is deposited, as by PECVD, on the laser cavities. This layer covers the top and side walls and the facets of the cavities. Therefore, an n-contact layer 318 is deposited on the back side (or lower surface as viewed in FIG. 7b) of substrate 304.

A photoresist layer 320 is then applied to the front side of the wafer (the top surface as viewed in FIG. 7c) on top of the thin layer 316, and with sufficient thickness as to completely cover the wafer and its laser cavities and to form a planar top surface 322. The absorbance of unexposed photoresist, such as the commercially available Shipley 51800 Series photoresists, is higher than the absorbance of an exposed photoresist, and this property is used to sufficiently expose the photoresist layer 320 to a depth that is slightly below the tops 324 and 326 of the cavities, as indicated at dotted line 328, with the remaining depth of the photoresist remaining unexposed.

Figure 7D:
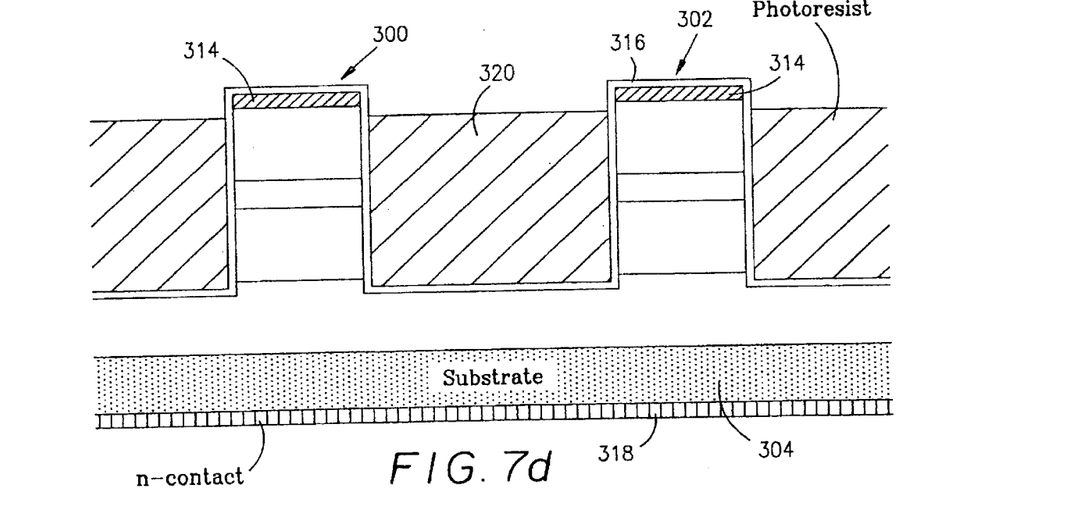
Figure 7E:
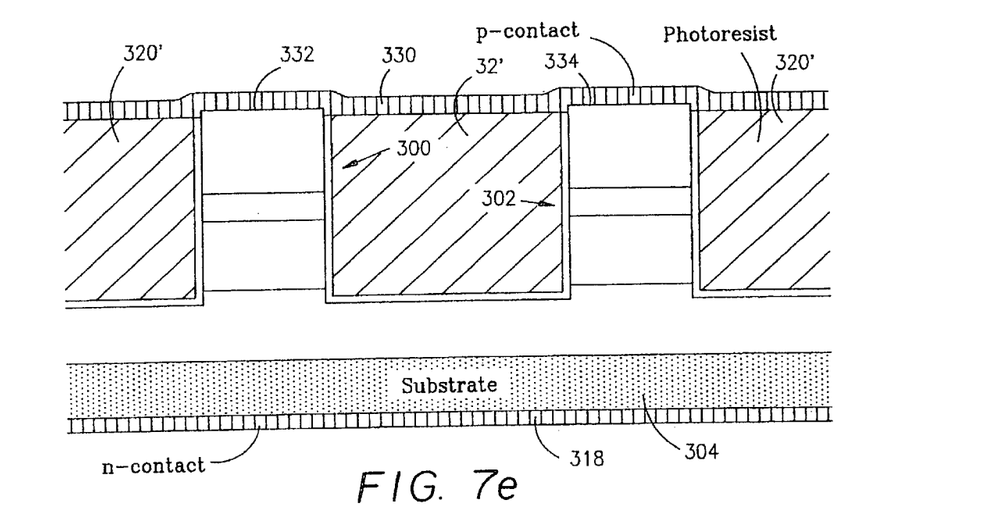

As illustrated in FIG. 7d, the photoresist is developed to remove the exposed photoresist above the depth indicated by line 328, leaving the lower unexposed portion of the photoresist in place. A buffered HF etch is then used to etch away the thin PECVD layer 316 and the remaining mask material 314 where these layers extend above the remaining photoresist material 320, as illustrated in FIG. 7e. Thereafter, the remaining photoresist is completely exposed, as illustrated at 320', but is not developed, and a p-contact layer 330 is deposited on the top surface of the wafer, covering the exposed photoresist 320' and the top surfaces 332 and 334 of cavities 300 and 302.

Figure 7F:
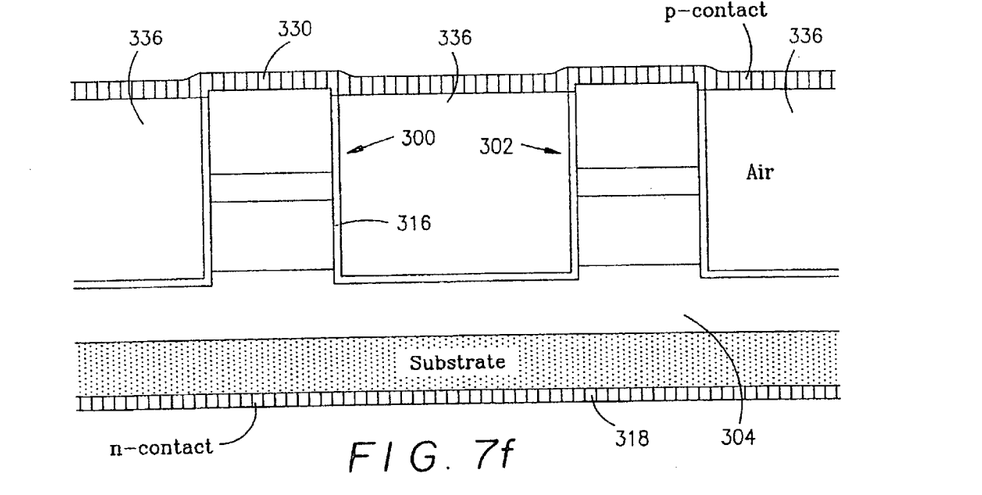

As illustrated in FIG. 7f, the wafer is then placed in a photoresist developer to remove the exposed photoresist 320' from under layer 330, leaving air-filled voids 336 surrounding the laser cavities 300 and 302. During this development stage, the thin silicon dioxide or silicon nitride layer 316 protects the side walls and facets of the cavities from the developer. The p-contact layer 330 forms a metallic bridge between the tops of adjacent cavities, and the air medium in the voids 336 can be replaced by another desirable gas, if desired, For InP based, 1550 nm emitting devices, the width of a cavity such as cavity 300 or 302 is less than 1.0 micron, and preferably is about 0.2 micron for single lateral mode operation.

Figures 8, 9:
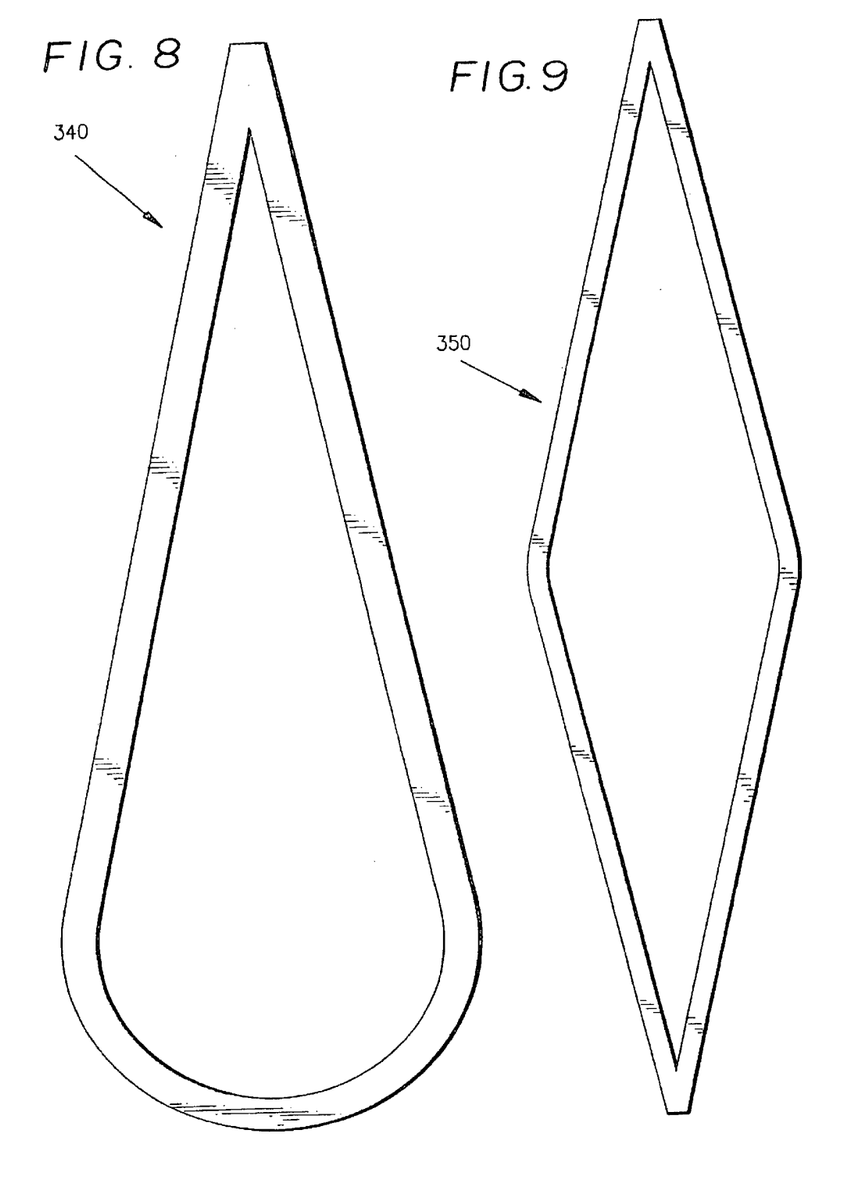
FIG. 8 illustrates a computer-aided design of a tear-drop shaped ring laser.
FIG. 9 illustrates a computer-aided design for a ring laser with two curved waveguide sections and two PT facets.
Figure 10:
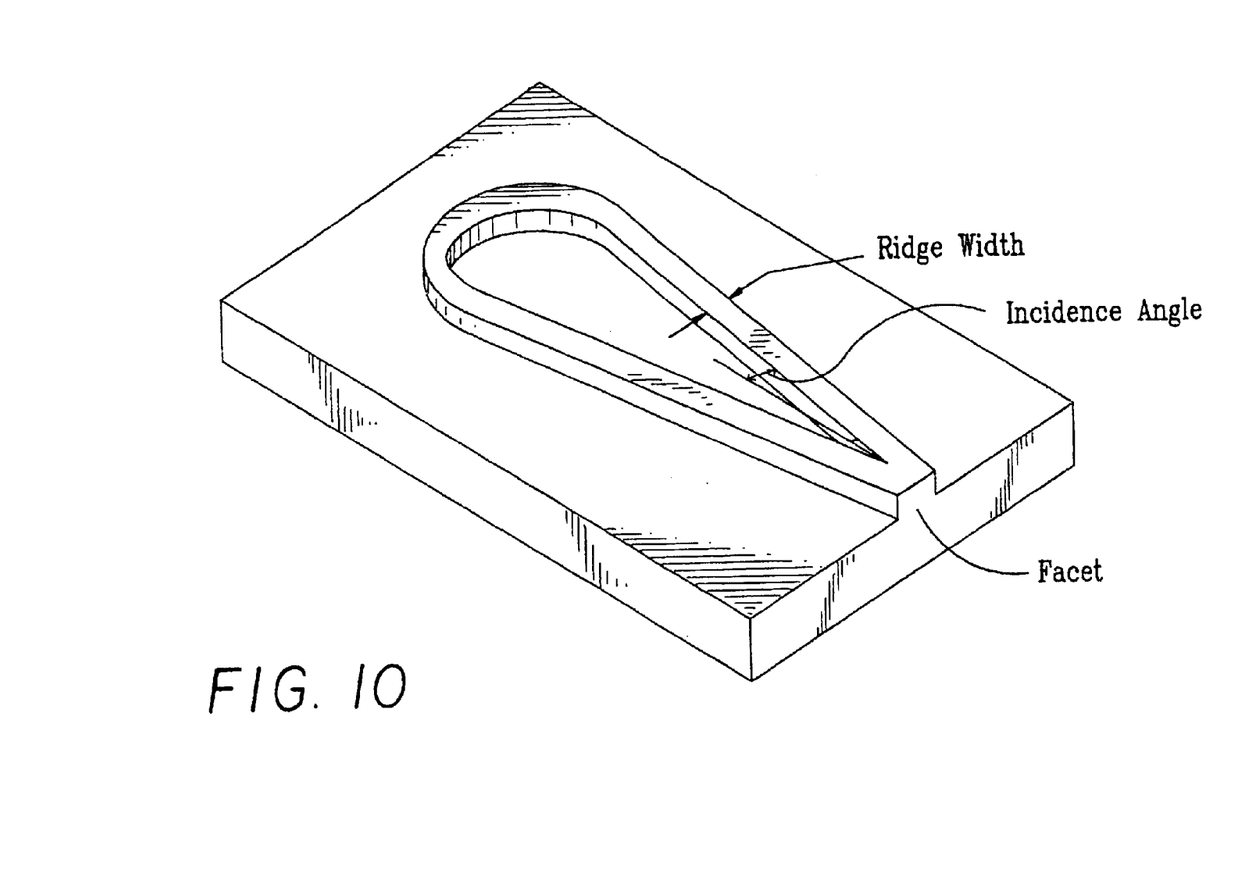
FIG. 10 illustrates in top perspective view a ridge version of a tear-drop shaped ring laser.

The curved cavity of the present invention works particularly well with the above-described narrow width process. FIGS. 8 and 9 illustrate computer-aided designs for the single lithographic mask layer needed to define the cavity length and width as well as the facets for curved cavity lasers, with FIG. 8 illustrating at 340 a teardrop-shaped ring laser mask and FIG. 9 illustrating at 350 a mask for a ring laser having two curved waveguide cavity sections and two PT facets. FIG. 10 is a perspective view of a ridge laser 360' which is teardrop shaped in the manner described with respect to FIG. 2.

Although the present invention incorporates lasers which are pumped by the application of a bias voltage and the resulting current in the laser cavity, other schemes, such as optical pumping, can be used to produce the desired optical traveling waves. However, the injection of current is the preferred scheme. The facets in each of the above described devices preferably are optically smooth; furthermore, the lasers preferably are of the laterally confined type.

Although the present invention has been illustrated in terms of preferred embodiments, it will be understood that variations and modifications may be made without departing from the true spirit and scope thereof as set out in the following claims.

What is claimed is:

1. A process for fabricating a curved waveguide traveling wave laser, comprising:

depositing a dielectric layer on a top surface of a wafer having an active region and upper and lower cladding regions;

patterning the dielectric layer to form a mask defining a curved waveguide;

transferring the mask to the wafer to form a laser cavity having a curved waveguide including a top surface, side walls and at least one facet;

depositing a thin, conformed dielectric layer over said laser cavity top surface, side walls and facet;

depositing a contact on a bottom surface of the wafer;

depositing a photoresist on said top surface of the wafer over said thin conformal dielectric layer to a thickness sufficient to completely cover the wafer and the laser cavity and to form a planar top surface;

exposing the photoresist to a depth below the top surface of said cavity;

removing the exposed photoresist;

removing the thin conformal dielectric layer from the top surface of said cavity;

depositing a p-contact layer on the top surface of said cavity; and removing the previously unremoved photoresist to leave a gas-filled void surrounding said cavity.

2. A method of fabricating a semiconductor laser cavity on a substrate, comprising:

forming a first cladding layer on a first surface of a doped semiconductor substrate;

forming an active layer on said first cladding layer;

forming a second cladding layer on said active layer;

fabricating an etch mask on said second cladding layer;

etching, through said mask, said first and second cladding layers and said active layer to define a curved laser cavity having spaced cavity segments and having a top surface covered by said mask;

depositing a thin conformal dielectric layer on said laser cavity;

depositing a first contact layer on a second surface of said semiconductor substrate;

surrounding said laser cavity with a photoresist layer;

exposing at least a portion of said top surface of said laser cavity;

applying a second contact layer by depositing a conductive layer on at least a portion of said photoresist layer and on said exposed portion of said top surface of said cavity to provide a conductive bridge between said spaced cavity segments; and removing said photoresist layer to expose said laser cavity.

3. The method of claim 2, wherein removing the photoresist layer includes developing the resist to leave a void under said conductive bridge.

4. The method of claim 3, further including filling said void with a gas.

5. The method of claim 3, wherein fabricating an etch mask includes lithographically fabricating a mask defining the shape of said laser cavity segments.

6. The method of claim 5, wherein fabricating a mask includes defining the width and length of the cavity and cavity segments and defining at least one facet for the cavity.

* * * * *